(12) United States Patent
Owens et al.

(10) Patent No.: US 6,795,316 B2
(45) Date of Patent: Sep. 21, 2004

(54) WDM ADD/DROP MULTIPLEXER MODULE

(75) Inventors: Mark J. Owens, Epping (AU); Chia Seiler, Bairnsdale (AU); Brian Robert Brown, Collaroy (AU); Mark Henry Bonwick, Frenchs Forest (AU); Quentin Scott, Pymble (AU); Robert Goh, Chatswood (AU); Ross Halgren, Collaroy Plateau (AU)

(73) Assignee: Redfern Broadband Networks, Inc., Wilimington, DE (US)

( * ) Notice: Subject to any disclaimer, the term of this patent is extended or adjusted under 35 U.S.C. 154(b) by 0 days.

(21) Appl. No.: 10/028,745

(22) Filed: Dec. 21, 2001

(65) Prior Publication Data

US 2003/0117771 A1 Jun. 26, 2003

(51) Int. Cl.⁷ ................................................ H05K 7/20
(52) U.S. Cl. ...................... 361/704; 361/699; 361/700; 174/15.2; 174/16.1; 165/80.3; 165/80.4; 165/104.26
(58) Field of Search ................................ 361/677, 678, 361/687–690, 694–704, 715, 716, 720, 721; 174/15.1, 15.2, 16.1, 16.3; 165/80.3, 80.4, 104.26, 104.33, 122; 62/259.2, 259.4

(56) References Cited

U.S. PATENT DOCUMENTS

| | | | |
|---|---|---|---|
| 4,122,508 A | | 10/1978 | Rumbaugh |
| 4,237,521 A | | 12/1980 | Denker |
| 4,587,593 A | * | 5/1986 | Liautaud et al. ............ 361/690 |
| 4,674,004 A | | 6/1987 | Smith et al. |
| 4,777,561 A | | 10/1988 | Murphy et al. |
| 4,881,792 A | | 11/1989 | Alameel et al. |
| 4,976,527 A | | 12/1990 | Horikawa et al. |
| 5,170,336 A | | 12/1992 | Getter et al. |
| 5,508,908 A | * | 4/1996 | Kazama et al. ............. 363/141 |
| 5,604,665 A | | 2/1997 | Chrysler et al. |
| 5,717,712 A | | 2/1998 | Swaminathan et al. |
| 5,808,871 A | | 9/1998 | Rosecan et al. |
| 5,842,514 A | | 12/1998 | Zapach et al. |
| 5,844,777 A | | 12/1998 | Gates |
| 5,887,435 A | | 3/1999 | Morton |
| 6,038,129 A | | 3/2000 | Falaki et al. |
| 6,044,899 A | * | 4/2000 | Langley et al. ........ 165/104.33 |
| 6,104,516 A | | 8/2000 | Majima |
| 6,104,611 A | | 8/2000 | Glover et al. |
| 6,105,875 A | * | 8/2000 | LaGrotta et al. .......... 236/44 A |
| 6,166,908 A | | 12/2000 | Samaras et al. |

(List continued on next page.)

FOREIGN PATENT DOCUMENTS

| | | |
|---|---|---|
| EP | 0 991 217 A2 | 4/2000 |
| EP | 1 061 683 A1 | 12/2000 |
| EP | 1 061 684 A1 | 12/2000 |
| EP | 1 063 794 A2 | 12/2000 |
| EP | 1 063 803 A1 | 12/2000 |
| EP | 1 063 802 B1 | 4/2002 |
| JP | 2001244664 A | 9/2001 |
| WO | WO 00/41349 | 7/2000 |
| WO | WO 01/42801 A1 | 6/2001 |

Primary Examiner—Boris Chervinsky
(74) Attorney, Agent, or Firm—Christie, Parker & Hale, LLP

(57) ABSTRACT

A casing member for a WDM add/drop multiplexer unit, the casing member comprising a backplane for interconnection of components of the WDM add/drop multiplexer unit inserted in the casing member, and at least one heat sink opening formed in a wall of the casing member disposed to, in use, receive a heat sink structure of a component of the WDM add/drop multiplexer unit in a manner such that the heat sink structure is exposed to an ambient around the casing member when the component is mounted in the casing member, for maintaining a controlled temperature environment inside of the component.

8 Claims, 11 Drawing Sheets

U.S. PATENT DOCUMENTS

| | | |
|---|---|---|
| 6,196,003 B1 | 3/2001 | Macias et al. |
| 6,212,075 B1 | 4/2001 | Habing et al. |
| 6,212,210 B1 | 4/2001 | Serizawa |
| 6,229,704 B1 | 5/2001 | Hoss et al. |
| 6,249,365 B1 | 6/2001 | Mizrahi et al. |
| 6,302,704 B1 | 10/2001 | Belanger, Jr. |
| 6,310,772 B1 * | 10/2001 | Hutchison et al. .......... 361/700 |
| 6,327,062 B1 | 12/2001 | King et al. |
| 6,364,541 B1 | 4/2002 | Nesnidal et al. |
| 6,411,511 B1 | 6/2002 | Chen |
| 6,415,612 B1 * | 7/2002 | Pokharna et al. ............. 62/3.2 |
| 6,418,015 B1 * | 7/2002 | Kociecki .................... 361/695 |
| 6,422,730 B1 | 7/2002 | Koren et al. |
| 6,430,053 B1 | 8/2002 | Peterson et al. |
| 6,477,294 B1 | 11/2002 | Jansen Van Doorn et al. |
| 6,501,659 B1 | 12/2002 | Bodensteiner et al. |
| 6,603,661 B2 | 8/2003 | Smith et al. |

* cited by examiner

WDM ADD/DROP MULTIPLEXER MODULE

FIELD OF THE INVENTION

The present invention relates broadly to a casing member for a WDM add/drop multiplexer unit, to a chassis member for carrying at least one circuit board, and to a WDM multiplexer module. The present invention also relates to an optical network node and to an optical network.

BACKGROUND OF THE INVENTION

Optical networks may be classified into long haul optical networks, metro optical networks, access optical networks and enterprise gear-optical networks. Distinctions between the different types may in a fist instance be drawn on the basis of physical transmission distances covered, decreasing from long haul optical networks down to enterprise gear-optical networks, with the latter being typically implemented within one location e.g. in one office building.

The different types of optical networks can also be distinguished in terms of the physical environment in which in particular add/drop equipment is located. For example, for enterprise gear-optical networks, the add/drop equipment is typically located inside of air conditioned buildings, and therefore no particular extreme temperature condition compliance is required to implement such optical networks. For long haul and metro optical networks, which typically involve very complex and expensive equipment, add/drop equipment is typically located in telecommunications carriers central offices and points of presence and are subjected to a limited range of temperatures, which is sometimes referred to as requiring the add/drop equipment to be carrier class compliant This temperature range is typically in the range of –5 to 55° C. as required for Telcordia NEBS level 3.

However, in access optical networks the add/drop equipment is typically located in an outside plant (OSP) situation, and thus potentially subjected to a wider temperature range than e.g. carrier class compliance requirements.

Currently, the only optical networks that can be implemented in scenarios where the required add/drop equipment is located in an OSP situation are Time Domain Multiplexing (TDM) based networks. So far, WDM based optical networks have not been deemed suitable for implementation in OSP situations, as currently available WDM equipment is not OSP compatible. However, it would be desirable to implement WDM based optical networks in such an environment, to utilise the larger capacity in the optical domain in access optical networks.

At least preferred embodiments of the present invention seek to provide a casing member for a WDM add/drop multiplexer module, a chassis member for carrying at least one circuit board, or a WDM multiplexer module suitable for use in an OSP situation.

SUMMARY OF THE INVENTION

In accordance with a first aspect of the present invention there is provided a casing member for a WDM add/drop multiplexer unit, the casing member comprising a backplane for interconnection of components of the WDM add/drop multiplexer unit inserted in the casing member, and at least one heat sink opening formed in a wall of the casing member disposed to, in use, receive a heat sink structure of a component of the WDM add/drop multiplexer unit in a manner such that the heat sink structure is exposed to an ambient around the casing member when the component is mounted in the casing member, for facilitating maintaining a controlled temperature environment inside of the component.

Preferably, the heat sink opening is formed in the backwall incorporating the backplane.

A pair of heat sink openings may be formed in a mirrored configuration on either side of the backplane with respect to a centreplane halfway along the width of the casing member.

In one embodiment, the casing member further comprises a first key member arranged, in use, to prevent a component of the WDM add/drop multiplexer unit from contacting the backplane, when said component is inserted upside down in its intended slot, or when it is inserted in another component's intended slot, and wherein the first key member is adapted to cooperate with a heat sink structure of said component.

The casing member may further comprise a second key member arranged, in use, to prevent a component of the WDM add/drop multiplexer unit from contacting the backplane, when said component is inserted upside down in another component's intended slot, and wherein the second key member is adapted to co-operate with a third key member formed on said component.

The casing member may further comprise at least one vent opening in one wall of the casing member. Preferably, the casing member comprises at least one pair of vent openings, the openings of the pair being formed in opposite walls of the casing member. In one embodiment, the at least one pair of vent openings is formed in the sidewalls of the housing. Alternatively or additionally, at least one pair of vent openings is formed in the top and bottom walls of the housing element.

The housing element may be adapted for horizontal or vertical mounting.

In a preferred embodiment, the housing element is adapted for mounting onto a rack structure.

In one embodiment, the casing member further comprises a heat sink unit mounted onto the casing member and adapted, in use, when components of the WDM add/drop multiplexer unit are inserted in the casing member, to make thermal contact with at least one of the components, for facilitating maintaining a controlled temperature environment inside of said component. Preferably, the heat sink unit is arranged in a manner such that, in use, the interconnection to said component is releasable.

The heat sink unit may be incorporated in the backwall incorporating the backplane. The heat sink unit may be formed on the backplane.

Preferably, the heat sink unit comprises a plurality of substantially planar fins disposed substantially parallel to the backwall of the casing member, and mounted by way of at least one longitudinal mounting member expanding substantially perpendicularly from the backwall. Accordingly, convection airflow between the fins is preferably not inhibited in either a horizontal or a vertical mounting position of the casing member.

The casing element may optionally further comprise at least one fan device mounted on the outside of the housing element and disposed in a manner such that, in use when the heat sink structure of the component of the WDM add/drop multiplexer unit extends through the heat sink opening of the housing element, the heat sink structure is subjected to an airflow generated by the fan device.

The casing member may further comprise at least one baffle structure externally mounted or formed on the casing member, and arranged in a manner such that in use when the casing member is mounted vertically into the rack structure, convection airflow from one heat sink structure or heat sink unit is diverted away from other heat sink structures or heat sink units.

In accordance with a second aspect of the present invention, there is provided a chassis member for carrying at least one circuit board, wherein the chassis member is adapted, in use, to function as a heatsink for a heat generating component mounted on the circuit board.

Preferably, a main body of the chassis is contoured or shaped in a manner such that, in use, a distance between the heat generating component and a region of the main body facing the heat generating component is reduced compared to other components on the circuit board.

Advantageously, the chassis member comprises sidewalls formed around the peripheral region of the main body and adapted to function in use, as at least a portion of housing sidewalls of a housing structure for the circuit board.

In one embodiment, the chassis member is adapted, in use, to carry at least one circuit board above and at least one circuit board below of the main body.

In accordance with a third aspect of the present invention, there is provided a WDM multiplexer module comprising a housing, a chassis member located substantially inside the homing and adapted to function as a heat sin, a heat sink structure extending from the housing and in thermal communication with the chassis member, at first thermoelectric (TE) device in thermal communication with the chassis member, at least one heat generating electrical component in thermal communication with the chassis member, and a control unit arranged, in use, to maintain a controlled temperature environment inside the housing utilising the heat sink structure, the TE device, and the heat generating electrical component and utilising the chassis member as a thermal communication medium.

Preferably, the module further comprises a local thermal environment structure located inside the housing and a second TE device in thermal communication with the chassis member and the local thermal environment structure, whereby, in use, a second stage controlled temperature environment is created substantially inside the local thermal environment structure, and wherein temperature variations in the second stage controlled temperature environment are smaller than temperature variations inside the housing.

In one embodiment, the module comprises at least one laser source disposed in a manner such that, in use, the source temperature of the laser source is substantially governed by the second stage controlled temperature environment. Preferably, the laser source is a semiconductor laser source, and a junction of the laser source is located substantially inside the local thermal environment structure.

The module may comprise a plurality of electrical components, and the control unit may further be arranged, in use dung start-up or re-start of the module, to sequentially switch on the electrical components based on operating temperature specifications and heat generating characteristics of the electrical components to facilitate creation of the controlled temperature environment.

Advantageously, the heat sink structure comprises at least one heat pipe. In one embodiment, the heat pipe has a working fluid characterized by a freezing temperature above −40° C., whereby a discontinuity in heat transfer to and from the heat sink structure is created for temperatures below the freezing temperature of the working fluid in the heat pipe for reducing heat loss from the inside of the housing. In one preferred embodiment, the freezing temperature is about zero ° C.

Advantageously, the chassis member comprises side walls formed around the peripheral region of a main body of the chassis member, and said side walls form at least a portion of housing side walls of the housing.

In a preferred embodiment, the housing is adapted to function as an electro-magnetic induction (EMI) shield.

The module may Anther comprise a first key member arranged, in use, to cooperate with a second key member formed on a casing member into which the module is inserted, to prevent the module from making contact with a backplane of the casing member when the module is inserted upside down into a slot of the casing member for which the module is not intended.

In accordance with a fourth aspect of the present invention, there is provided a method of thermal control of a WDM multiplexer module, the method comprising the steps of maintaining a first stage controlled temperature environment inside the module and maintaining a second stage controlled temperature environment in at least a portion of the inside of the module, wherein temperature variations in the second stage controlled temperature environment are smaller than temperature variations of the first stage controlled temperature environment.

In one embodiment, the module comprises at least one laser source, and the source temperature of the laser source is substantially governed by the second stage controlled temperature environment.

The module may comprise a plurality of electrical components, and the method may further comprise, during start-up or re-start of the module, the step of sequentially switching on the electrical components based on operating temperature specifications and heat generating characteristics of the electrical components to facilitate creation of the first stage controlled temperature environment.

Advantageously, the maintaining of the first and second stage controlled temperature environments comprises utilising at least one heat pipe. In one embodiment, the heat pipe has a working fluid characterised by a freezing temperature above −40° C., whereby a discontinuity in heat transfer to and from the heat sink structure is created for temperatures below the freezing temperature of the working fluid in the heat pipe for reducing heat loss from the inside of the housing. In one preferred embodiment, the freezing temperature is about zero ° C.

In accordance with a fifth aspect of the present invention, there is provided an optical network node incorporating a casing member for a WDM add/drop multiplexer unit in accordance with the first aspect of the present invention, a chassis member for carrying at least one circuit board in accordance with the second aspect of the present invention, or a WDM multiplexer module in accordance with the third aspect of the present invention.

In accordance with a sixth aspect of the present invention, there is provided an optical network incorporating an optical network node in accordance with the fifth aspect of the present invention.

BRIEF DESCRIPTION OF THE DRAWINGS

Preferred embodiments of the present invention will now be described, by way of example only, with reference to the accompanying drawings.

DETAILED DESCRIPTION OF THE EMBODIMENTS

Figure 1:
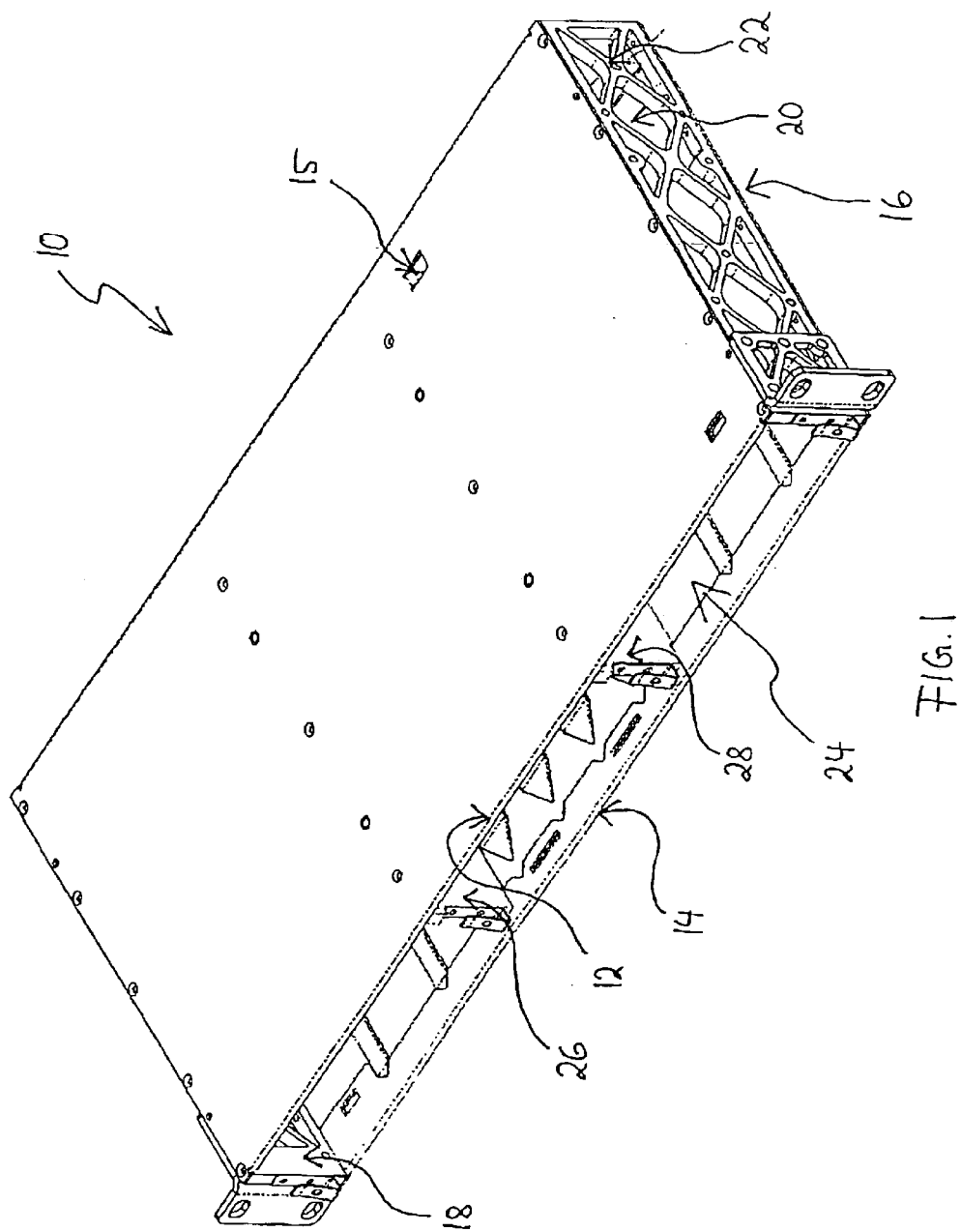
FIG. 1 shows a perspective view of a casing embodying the present invention.

In FIG. 1, a casing 10 embodying the present invention comprises top and bottom covers 12, 14 respectively. The casing 10 further comprises side walls 16, 18 respectively. Vent openings in the form of openings e.g. 20 in a mesh-type structure 22 forming the side walls e,g. 16 are incorporated for, in use, fluid communication between the inside 24 of the casing 10 and the surrounding ambient. The casing 10 further comprises intermediate walls 26, 28.

Figure 2:
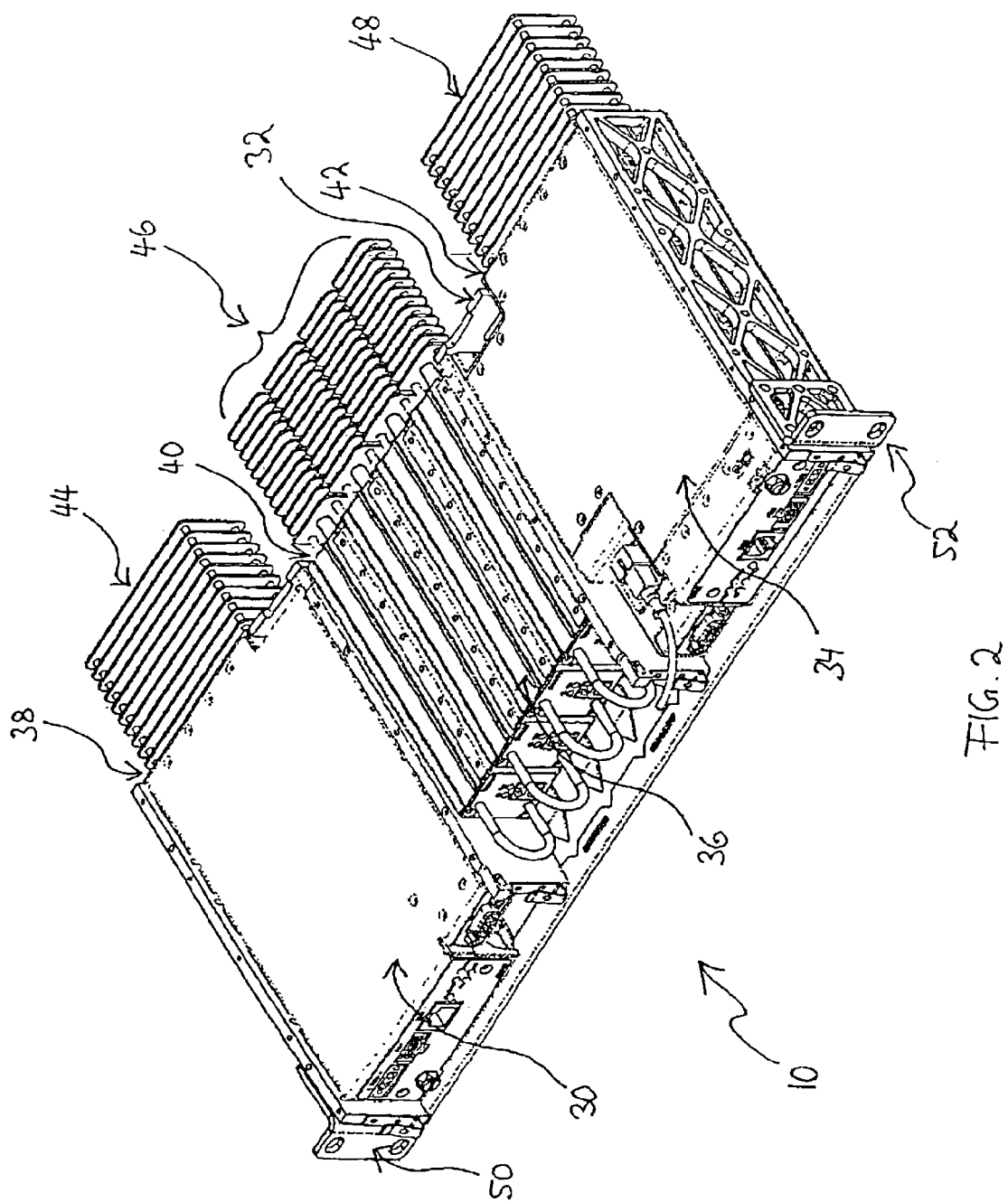
FIG. 2 shows a perspective view of the casing of FIG. 1, with the top cover removed and components of a WDM add/drop multiplexer unit inserted.

As can be seen more clearly in FIG. 2, which shows the casing 10 without the top cover 12 (see FIG. 1) and with components e.g. 30 of WDM add/drop unit inserted, the casing 10 further comprises a backplane in the form of a mother board 32, for connection and interconnection of the inserted components e.g. 30, 34, and 36. The functionality of the various components will be described later with reference to FIGS. 10 and 11. It is noted that in the embodiment shown in FIG. 2, the casing 10 is designed in a manner such that the heat sink openings 38 and 42, and the backplane 32 are mirrored with respect to a centreplane halfway along the width of the casing 10. This enables an optimal spacing between the set of fins 44, 46, and 48. At the same time, to facilitate that components 30 and 34, which, in end use, have different functionality and specifications, may initially undergo the same manufacturing steps and can be manufactured along the same production line up to a certain step, the components 30 and 34 are inserted with a "swapped" orientation. In other words, in terms of the individual chassis/housing of the components, 30 and 34, they are disposed upside down with respect to each other. To prevent inadvertent insertion of the wrong component, the electrical connections to the backplane 32 are keyed appropriately. Overall, the components 30, 34 are thus hot-swappable on-site.

In the example embodiment, and as shown in FIG. 1, the casing member 10 comprises two key members in the form of two banded flaps e.g. 15 formed on the top and bottom covers 12, 14 respectively, and in a mirrored fashion in relation to the centreplane halfway along the width of the casing 10. In use, e.g. flap 15 will prevent that component 30 (see FIG. 2) is fully inserted in the space intended for component 34 (see FIG. 2), or that component 34 (see FIG. 2) is fully inserted upside down in its intended space. It will be appreciated by the person skilled in the art that the flap 15 is designed in the example embodiment to abud the set of fins 44 (see FIG. 2) or 48 (see FIG. 2), for preventing contact with the backplane 32 (see FIG. 2) in those circumstances.

Furthermore, and referring now to FIG. 2, the casing 10 further comprises secondary key members in the form of protrusions formed on sidewalls 26, 28 respectively and extending towards the components 30 and 34 respectively. The protrusions, which are hidden in FIG. 2 as will be appreciated by the person skilled in the art, are arranged in a manner such that they cooperate with protrusions, in the example embodiment in the form of screws (not shown) screwed onto the respective components 30, 34 to prevent insertion of components 30, 34, when turned upside down, into the position intended for the other component to an extent that they make contact with the backplane 32. It will be appreciated by the person skilled in the art, that accordingly, in the example embodiment, the casing 10 is double-keyed to prevent wrong insertion of components 30, 34.

It is noted that in the example embodiment, the respective contacts (not shown) on the backplane 32 intended for the components 30, 34 are disposed in a manner such that their relative positioning on the backplane 32 is effectively an upside down and left/right swapped configuration, which further facilitates that components 30 and 34 may be manufactured along the same production line up to a certain step, as mentioned above. At the same time, wrong insertion of the individual components in the swapped orientation in the other component's spot is prevented, in the example embodiment, through the secondary key member as described above.

The casing 10 further comprises three heat sink openings 38, 40 and 42. The heat sink openings 38, 40, and 42 are each disposed in a manner such that heat sink structures in the form of sets of fins 44, 46, and 48 respectively extend therethrough to be exposed to the ambient outside of the casing 10. The sets of fins 44, 46, and 48 are part of the inserted components 30, e.g. 36, and 34 respectively, i.e. they are not mounted to or formed integrally with the casing 10. It will be appreciated by a person skilled in the art that accordingly, unlike in prior art designs, in the casing 10 embodying the present invention the provision of heat sinks in the form of e.g. fins has been separated from the casing 10 per se. Rather openings 38, 40 and 42 are provided through which heat sink structures of individual components inserted in the casing 10 can be received and exposed to the ambient outside the casing 10. It will be appreciated that this increases the flexibility concerning temperature control requirements of e.g. a WDM add/drop multiplexer unit mounted by way of the casing 10, as compared to prior art designs in which such heat sink structures are incorporated in the housing. In other words, if a temperature control requirement for an individual component changes, and thus an associated heat sink structure needs to be re-designed, this re-design does not require a re-design of the casing 10.

The casing 10 further comprises mounting brackets 50, 52 for mounting the casing 10 onto a rack structure (not shown).

Figure 3:
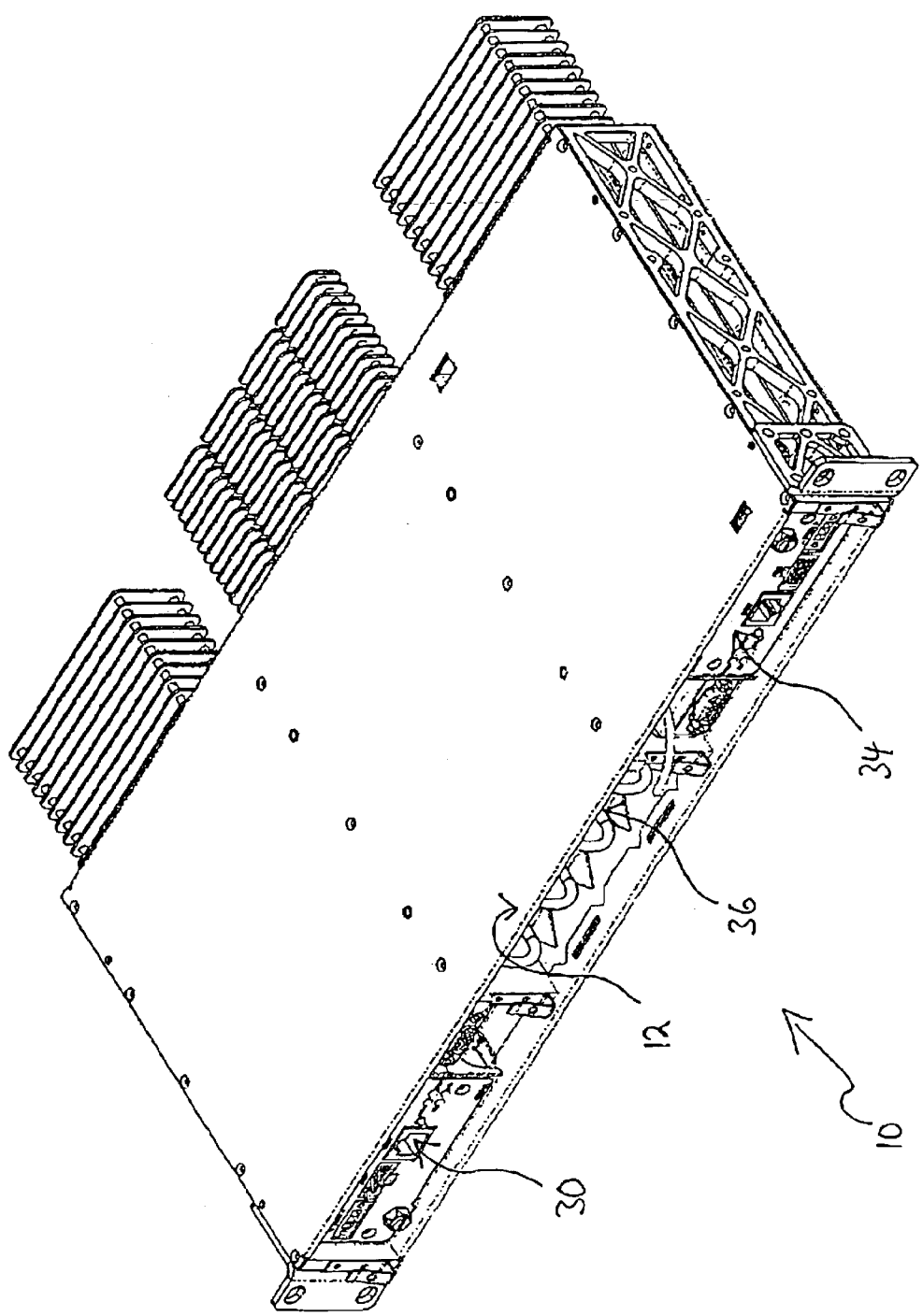
FIG. 3 is a perspective view of the casing of FIG. 1 with components of a WDM add/drop multiplexer unit inserted.

FIG. 3 shows the casing 10 including the top cover 12 and with the components of a WDM add/drop unit inserted, e.g. components 30, 36, and 34.

Figure 4:
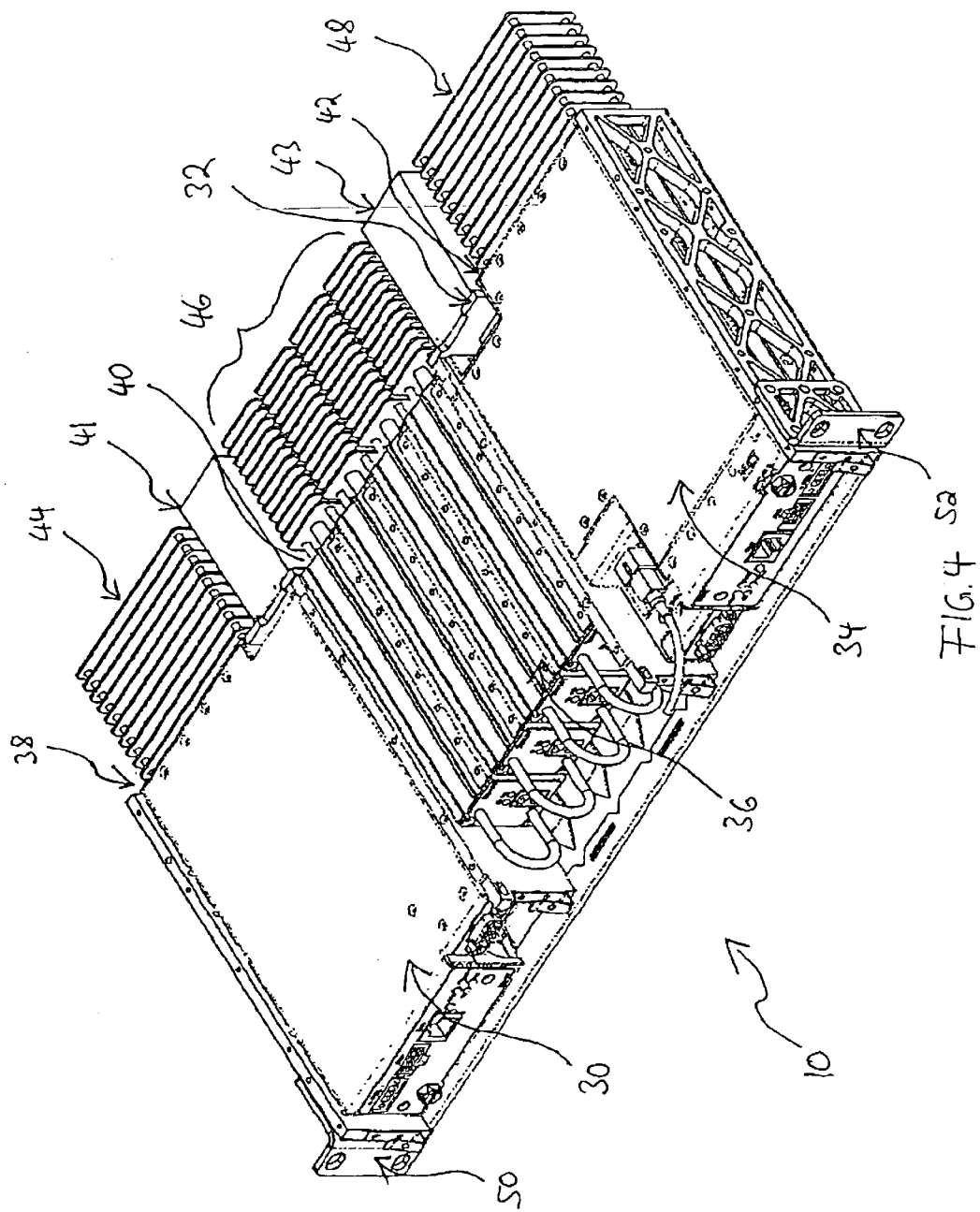
FIG. 4 is a perspective view of another casing embodying the present invention.

In an optional modification of the casing 10, shown in FIG. 4, fans 41, 43 are mounted onto the backplane 32 in the space between the sets of fins 44, 46, and 48. The fans 41, 43 are disposed in a manner such that they generate an airflow substantially in the plane of the casing 10 and parallel to the fins. The embodiment shown in FIG. 4 is suitable for situations where limited space is provided around the set of fins 44, 46, and 48 when the casing 10 is mounted onto a rack (not shown), to facilitate maintaining a controlled temperature environment of the WDM add/drop multiplexer unit. It will be appreciated by the person skilled in the art that, depending on requirements, only one or more than two fans may be provided in alternative embodiments.

Figure 5:
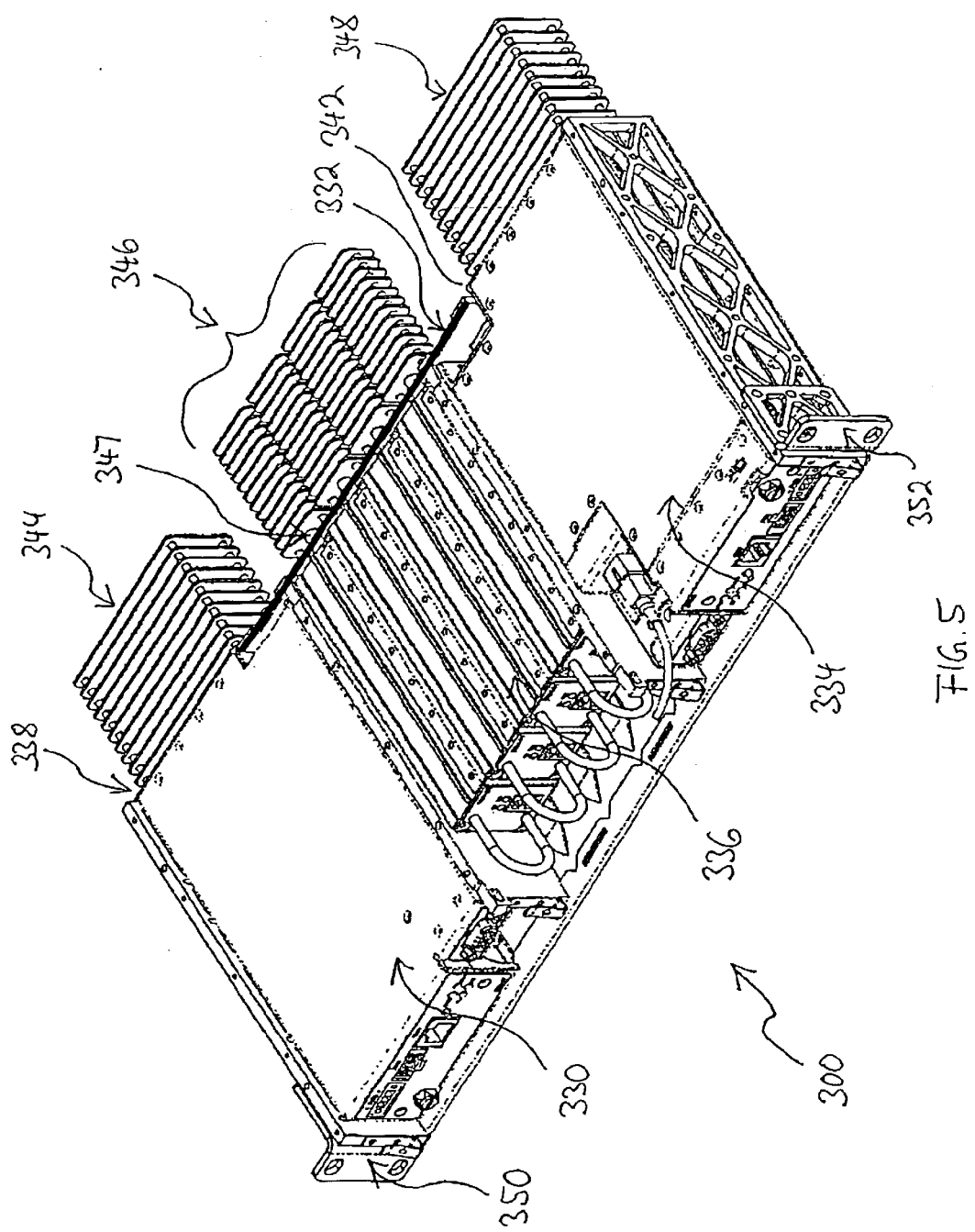
FIG. 5 is a perspective view of another casing embodying the present invention.

In another embodiment shown in FIG. 5, a casing 300 again comprises two heat sink openings 338, 342 for receiving heat sink structures 344, 348 of components 330, 334 of a WDM add/drop multiplexer unit. However, in this embodiment the casing 300 comprises a heat sink unit in the form of a set of fins 346 and heat pipes e.g. 347 externally mounted on a backplane 332 of the casing 300. Additional components, e.g. 336 of the WDM add/drop multiplexer unit, which are inserted into the casing 300, do not contain integral heat sink structures, but rather they are adapted to thermally connect to the set of fins 346 and the heat pipes e.g. 347, when inserted. The thermal connection is adapted to be releasable for replacement of such components, e.g. 336. This "hybrid" solution of combining heat sink openings e.g. 338 with a heat sink structure mounted onto the actual casing 300 can provide an alternative of design for best overall thermal performance of the WDM add/drop multiplexer unit. Parameters to be considered in choosing the optimum design are expected to include the relationship between the space consumed by an individual component and the heat it generates, and the size-requirements of the backplane to provide the electrical interconnections between the components.

It is noted that in the embodiments described above with reference to FIGS. 1 to 5, the design of the respective set of fins 44, 46, 48 and 344, 346, 348 is chosen such that the casings may be mounted horizontally or vertically. The fins are substantially planar and disposed parallel to the backwall of the casing. Furthermore, the heat pipes are formed longitudinally and without bends. It will be appreciated by the person skilled in the art, that accordingly, airflow between the fins is enabled with reduced, and preferably minimum restriction in either or horizontal or vertical mounting position.

Furthermore, the embodiments described above with reference to FIGS. 1 to 5 are dimensioned to fit into a 19 inch rack, and have a height of one unit. However, it will be appreciated by the person skilled in the art that the present invention is not limited to a particular overall size.

Figure 6:
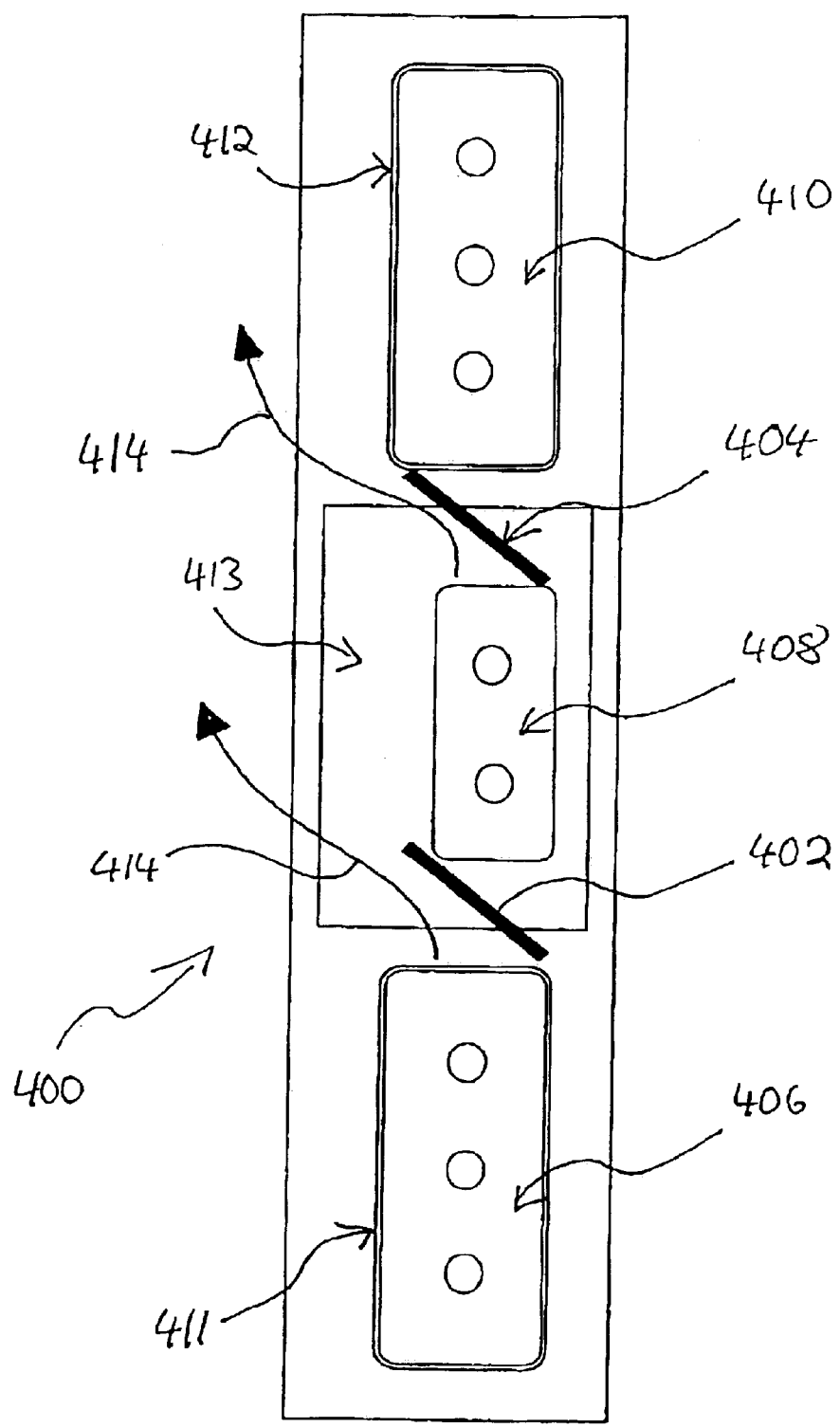
FIG. 6 is a schematic back view of another casing embodying the present invention.

In yet another embodiment schematically shown in FIG. 6, for a casing 400 which is to be vertically mounted, the casing 400 may comprise baffle structures 402, 404 disposed between sets of fins 406, 408 and 410. In this embodiment, the set of fins 406, 410 are formed integrally with components (not shown) inserted into the casing 400 and extending through heat sink openings 411, 412 of the casing 400. The fins 408 are mounted on a backplane 413 of the casing 400, and interconnect (releasably) to other components (not shown) inserted into the casing 400.

The baffle structures 402, 404 are disposed in a manner such that convection airflow from one set of fins is diverted from the other sets of fins as indicated by arrows 414. It will be appreciated by the person skilled in the art, that thus a successive heating of the convection air from the lowest set of fins 406 to the highest set of fins 410 can be reduced, and preferably be avoided.

Figure 7:
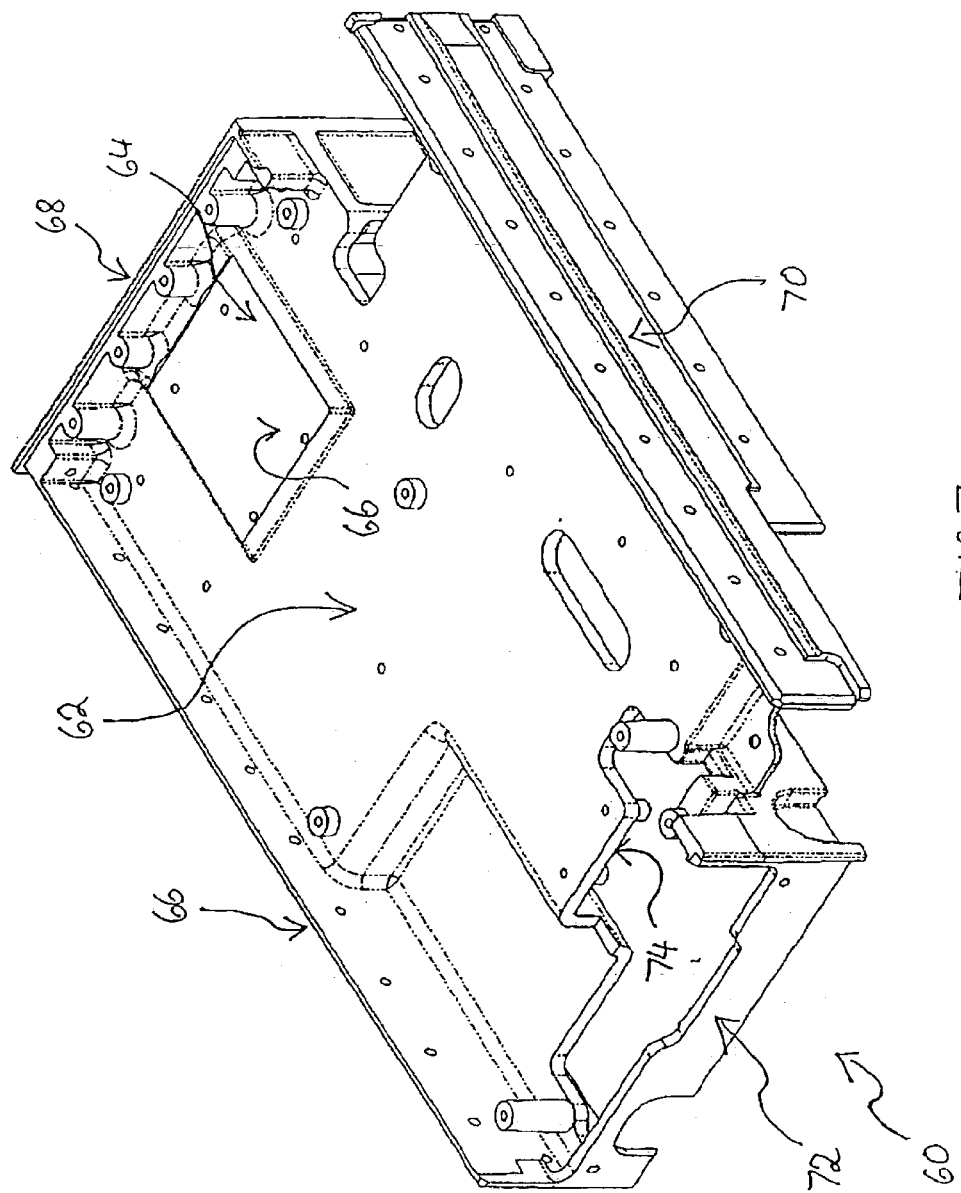
FIG. 7 is a perspective view of a chassis member embodying the present invention.

Turning now to FIG. 7, there is shown a chassis member 60 for carrying a plurality of circuit boards (not shown). The chassis member 60 is formed from a material having thermal characteristics suitable such that the chassis member 60 can, in use, function as a heat sink for heat generating electrical components (not shown) on the circuit boards (not shown) carried on the chassis member 60. In the example embodiment, the chassis member is formed form a zinc aluminium alloy.

Furthermore, the main body 62 of the chassis member 60 is contoured or shaped in a manner such that a distance between individual heat generating components (not shown) on the circuit boards (not shown) and regions of the main body facing the heat generating components is reduced compared to other components (not shown) on the circuit boards (not shown).

For example, the main body 62 comprises a raised portion 64 disposed in a manner such that, when a circuit board containing a particular heat generating electrical component is mounted on the chassis member 60, a distance between the top surface 66 of the raised portion 64 and the heat generating component (not shown) is reduced compared to other components (not shown) on the board (not shown).

The chassis member further comprises side wall structures 66, 68, 70 and 72 substantially around the peripheral region of the main body 62. The side wall portions 66, 68, 70 and 72 are formed integrally with and from the same material as the main body 62, and are adapted to function as at least portions of housing side walls of a housing structure (not shown) for the circuit boards (not shown) carried by the chassis member 60 and forming a WDM multiplexer module.

The chassis member 60 is further designed in a manner such that additional circuit boards (not shown) can be mounted to the "underside" 74 of the main body 62.

Figure 8:
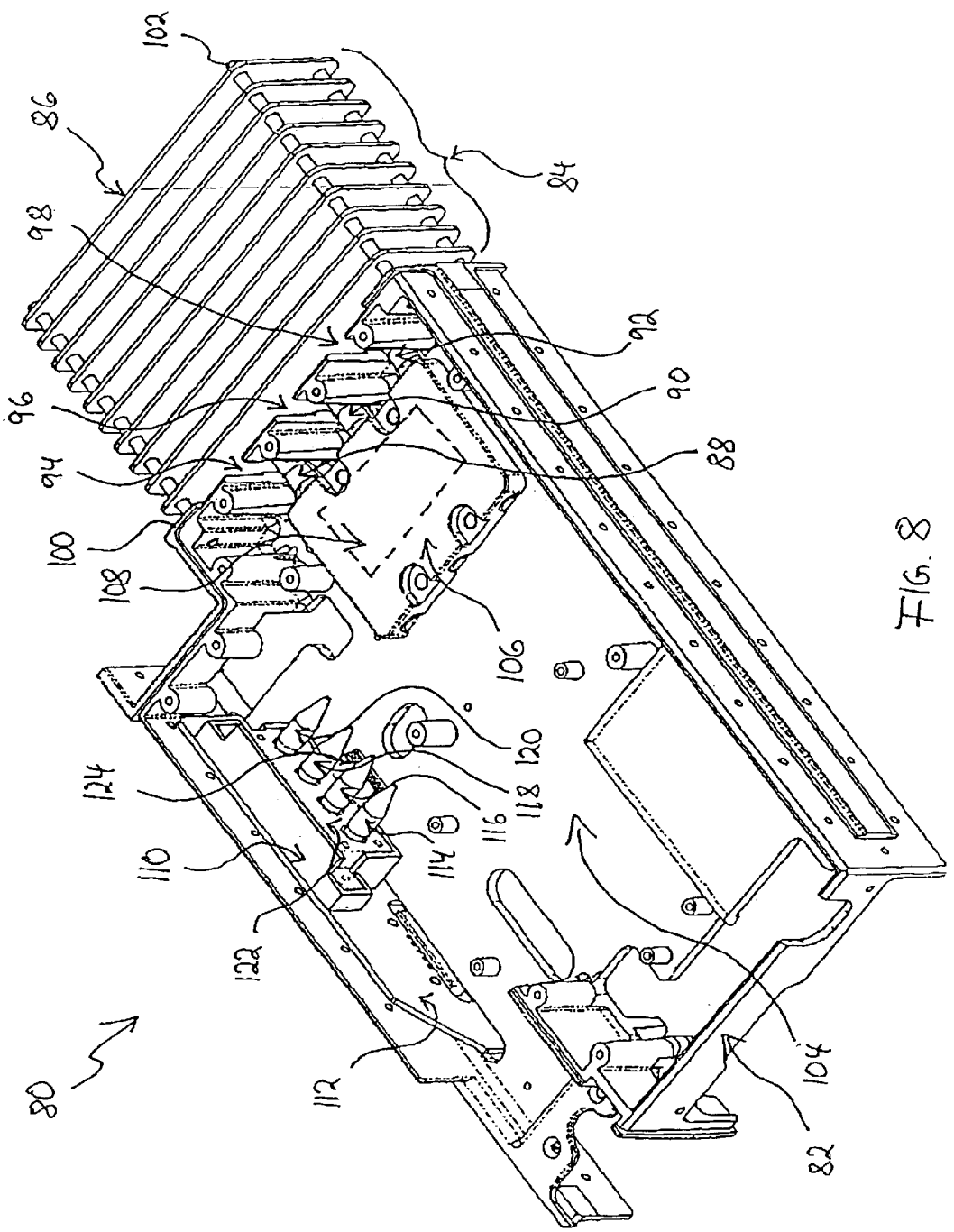
FIG. 8 shows a perspective view of paths of a WDM multiplexer module embodying the present invention.

Turning now to FIG. 8, there are shown parts of a WDM multiplexer module 80 comprising a chassis member 82 and a heat sink structure 84. The heat sink structure 84 comprises a plurality of fins e.g. 86 mounted on to three water based heat pipes 88, 90 and 92, extending through slots 94, 96, 98 respectively of a side wall portion 100 of the chassis member 82. The heat sink structure 84 further comprises four protective mounting rods e.g. 102 disposed in a manner such as to relief the heat pipes 88, 90, 92 from excessive load bearing as a result of a force being applied to one or more of the fins 86.

The heat pipes 88, 90, and 92 are mounted inside the WDM multiplexer module 80 and onto a main body 104 of the chassis member 82 by way of a thermally conducting mounting bracket 106. A TE device in the form of a thermoelectric conductor/cooler (TEC) 108 is located underneath the mounting bracket 106 and thermally connected to the main body 104 of the chassis member 82.

A local thermal environment structure including, in the example embodiment a laser housing 110 is mounted inside of the WDM multiplexer module 80 by way of a vertically mounted circuit board 112. Four semiconductor laser elements 114, 116, 118, and 120 are mounted in a manner such that their respective junction regions are located substantially inside or immediately adjacent to a thermally conductive base member 122 inserted in the laser housing 110, forming, in the example embodiment, the local thermal environment structure. A second TEC 124 is mounted on the main body 104 of the chassis member 82 and in thermal contact with base member 122 and thus with the laser structure 110.

It is noted that in the example embodiment illustrated in FIG. 8, the laser drivers (not shown) associated with the lasers 114, 116, 118 and 120 will be located outside the laser housing 110, i.e. outside the local thermal environment created within the laser housing 110 (and conductive base member 122). The laser drivers (not shown) in the assembled module will be located on a circuit board (not shown) mounted on the main body 104 of the chassis member 82, i.e. their thermal environment will be governed by the "primary" thermal environment inside the module 80. It has been found that laser drivers rated to a temperature range that is compatible with the primary thermal environment are available for the design of the example embodiment.

In the following, operation of the heat control features of the WDM multiplexer module 80 to create a controlled temperature environment inside thereof will be described for an example setting of first and second stage temperature ranges.

For the purpose of this description, a maximum temperature range for an OSP situation is assumed to be from −40° C. to +65° C.

In the high temperature extreme ambient situation of +65° C., the temperature inside the WDM multiplexer 80 may be estimated to reach 85° C., due to heat generation from electronic devices (not shown) incorporated in the WDM multiplexer unit 80. This is with only the heat sink structure comprising heat pipes 88, 90, 92 and the set of fins 84 considered at this stage.

In the example embodiment, the first stage temperature control is completed through utilising the first TEC 108 to reduce the temperature inside the WDM multiplexer unit 80 by 5° C. to 80° C. With the TEC 108 being thermally connected to the thermally conducting chassis member 82, it will be appreciated that a relatively homogenous temperature profile can be achieved inside the WDM multiplexer module 80.

For the majority of components incorporated in the WDM multiplexer 80, this maximum temperature of 80° C. is tolerable. However, in the example embodiment shown in FIG. 5, the lasers 114, 116, 118 and 120 are to be kept in a more tightly confined temperature range for specific reasons, including laser emission efficiency, wavelength stability, and accommodation of component variances between different lasers.

Accordingly, in a second stage temperature control, the 80° C. environment inside the WDM multiplexer module 80 is locally reduced around the respective junctions of the lasers 114, 116, 118 and 120 by way of TEC 124 and via and the thermally conductive base element 122 located inside the laser housing 110. In the example embodiment, the temperature around the respective junctions of the lasers 114, 116, 118, and 120 is reduced from +80° C. inside the WDM multiplexer module 80 to +50° C. in and around the base element 122 for the high temperature extreme ambient situation.

At the low temperature extreme ambient situation of −40° C., it is assumed that the operation of heat generating components (not shown) inside the WDM multiplexer module 80 will again increase the temperature inside the WDM multiplexer module 80 by 20° C. to −20° C. However, it is noted that due to variations in heating efficiencies with temperature and/or due to the fact that the water based heat pipes 88, 90, 92, which freeze below substantially 0° C., create a discontinuity in heat transfer to the set of fins 84, the temperature increase inside the WDM multiplexer module 80 as a result of heat generation from the heat generating components may be larger than 20° C. However, if for illustrative purposes a temperature increase to −20° C. is assumed, the first stage temperature control in addition comprises utilising the TEC 108 to increase the temperature inside the WDM multiplexer module 80 by a further 20° C. to 0° C.

Accordingly, the first stage temperature control has "buffered" the ambient temperature range of −40° to +65° to a temperature range of 0° C. to +80° C. inside the WDM multiplexer module 80. It is noted that while the high temperature end point is increased due to the internal heat generation, the overall range is reduced. It has been found that the WDM multiplexer module 80 can be designed in a manner such that this temperature range is tolerable for most of its components in an OSP situation.

Again, the lasers 114, 116, 118 and 120 do, however, require a more tightly confined temperature range, and thus the local thermal environment around the respective junctions of the lasers 114, 116, 118 and 120 at the low temperature end is "lifted" by a further 40° C. to +40° C. utilising TEC 124.

As a result, the second stage temperature environment range is from +40° C. to +50° C., for an ambient temperature range of −40° C. to +65° C. It has been found that this temperature range is satisfactory for construction of a WDM multiplexer module for use in an OSP situation.

Figure 9:
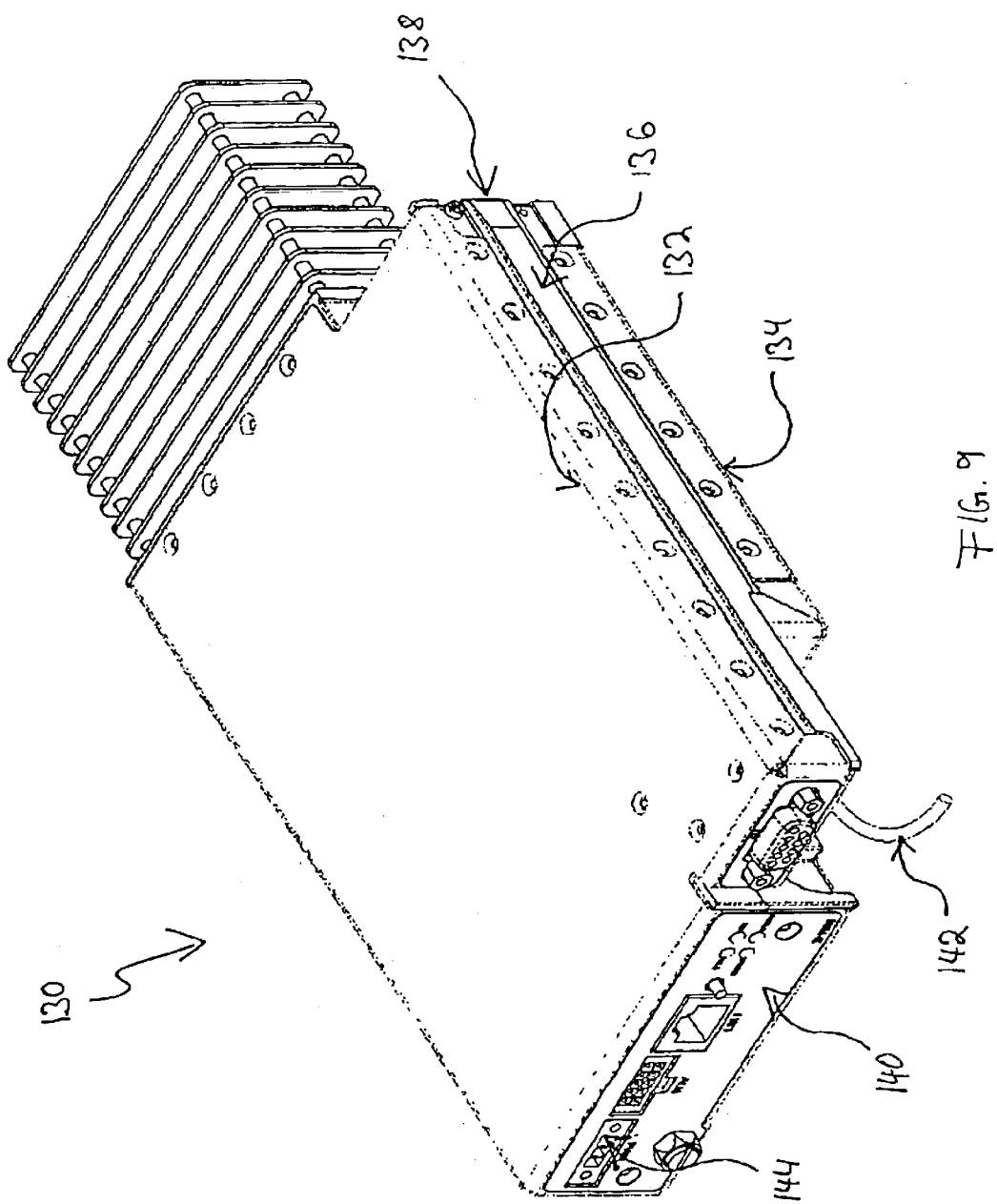
FIG. 9 shows a perspective view of an assembled WDM multiplexer module embodying the present invention.

FIG. 9 shows an assembled WDM multiplexer module 130 embodying the present invention and suitable for use in an OSP situation. A housing structure comprising covers 132 and 134 is completed by side wall portions e.g. 136 of a chassis' member 138 of the WDM multiplexer module 130. On the front plane 140 of the WDM multiplexer module 130, suitable connections/connectors are provided, including to a trunk optical fibre network link 142 and a power connection 144. The housing structure is further designed in a manner such that it functions as an EMI shield for the internal components of the WDM multiplexer module 130.

In the following, some further features of a WDM multiplexer module embodying the present invention will be described for start-up or re-start scenarios at the low temperature end of an OSP situation. At the low temperature end of −40° C., it may be detrimental to power up all of the electrical components of the WDM multiplexer structure at once. It is assumed that in the start-up or re-start situation, all power was initially cut, i.e. the TECs are also inoperable.

Some of the components may either malfunction or even break down when operated at such low temperatures. Accordingly, in an embodiment of the present invention, a control unit is utilised to sequentially power up groups and/or individual ones of the internal electrical components, based on operating temperature specifications and heat generating characteristics of the electrical components. This (a) saves those components not suitable for power up from malfunction/breakdown, and (b) forms the first step of a first stage temperature control similar to the one described above with reference to FIG. 5, i.e. it facilitates a temperature increase inside the WDM multiplexer module due to heat generation from the powered up components. When or as the temperature is raised internally due to the heat generation, remaining components are powered up in a then increased temperature environment designed to be safe for those components.

In the following, the functionality of a WDM add/drop multiplexer structure for use at a node in an optical Access network embodying the present invention will be described with reference to FIGS. 10 and 11.

Figure 10:
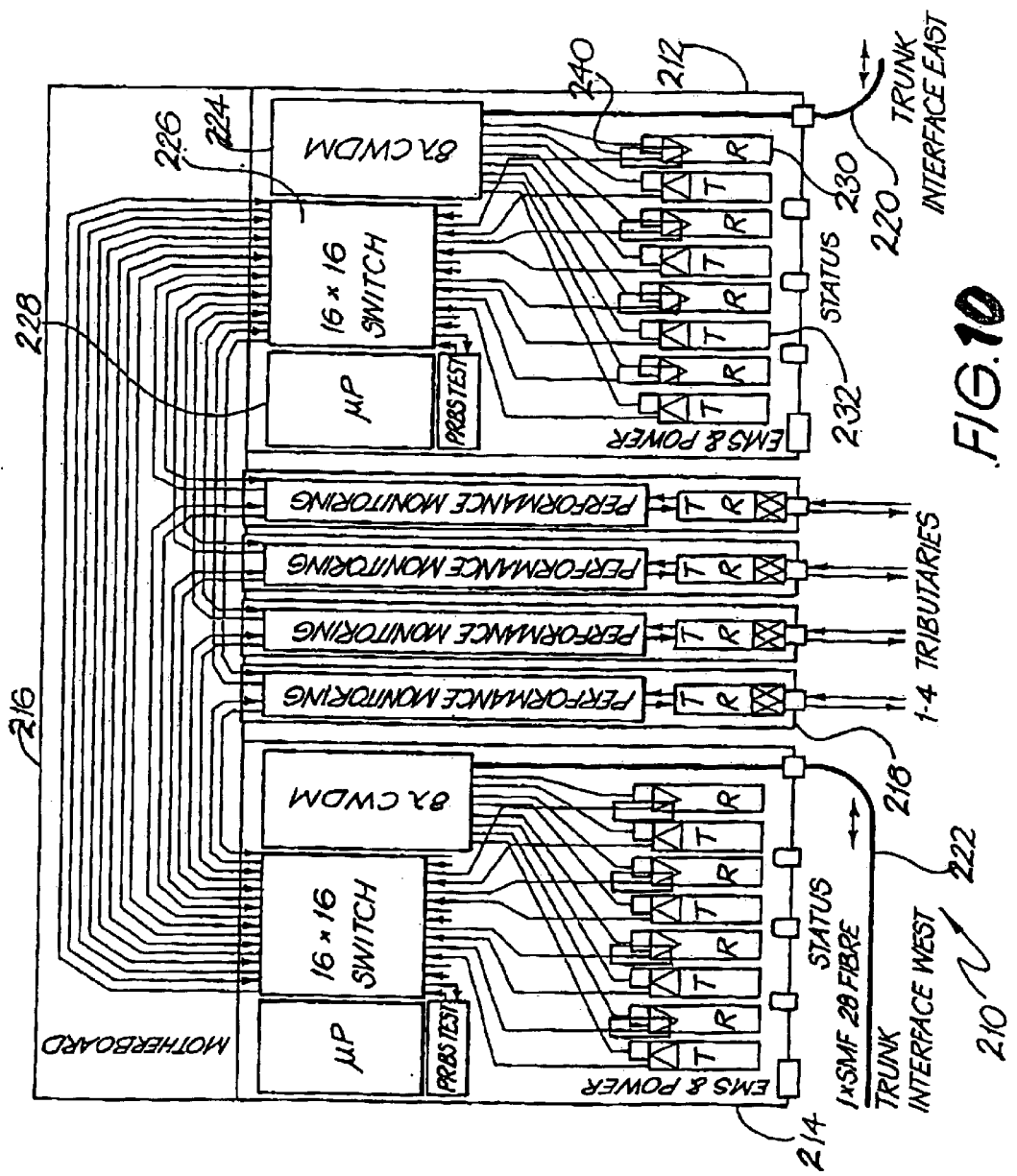
FIG. 10 is a schematic diagram illustrating a WDM add/drop multiplexer unit embodying the present invention.

FIG. 10 shows a schematic diagram of a network node structure 200 for use in an Access WDM network embodying the present invention. The node structure 200 comprises two network interface modules 212, 214, an electrical connection motherboard 216 and a plurality of tributary interface modules e.g. 218. The network interface modules 212, 214, the electrical connection motherboard 216 and the plurality of tributary interface modules e.g. 218 compare with items 30, 34, 32, and 36 respectively in FIG. 2.

Returning to FIG. 10, the network interface modules 212, 214 are connected to an optical network east trunk 220 and an optical network west trunk 222 respectively, of a WDM optical network (not shown) to which the network node structure 210 is connected in-line. The WDM optical network may for example be arranged as a WDM optical ring network, or as a WDM linear optical network.

Each of the network interface modules 212, 214 comprises the following components:

- a passive CWDM component 224, in the exemplary embodiment a 8 wavelength component.
- an electrical switch component, in the exemplary embodiment a 16×16 switch 226;
- a microprocessor 228;
- a plurality of receiver trunk interface cards e.g. 230; and
- a plurality of transmitter trunk interface cards e.g. 232, and
- a plurality of electrical regeneration unit e.g. 240 associated with each receiver trunk interface card e.g. 230.

Each regeneration unit e.g. 240 performs 3R regeneration on the electrical channels signal converted from a corresponding optical WDM channel signal received at the respective receiver trunk interface card e.g. 230. Accordingly, the network node structure 200 can provide signal regeneration capability for each channel signal combined with an electrical switching capability for add/drop functionality, i.e. avoiding high optical losses incurred in optical add/drop multiplexers (OADMs).

Details of the receiver trunk interface cards e.g. 230 and regeneration unit e.g. 240 of the exemplary embodiment will now be described with reference to FIG. 11.

Figure 11:
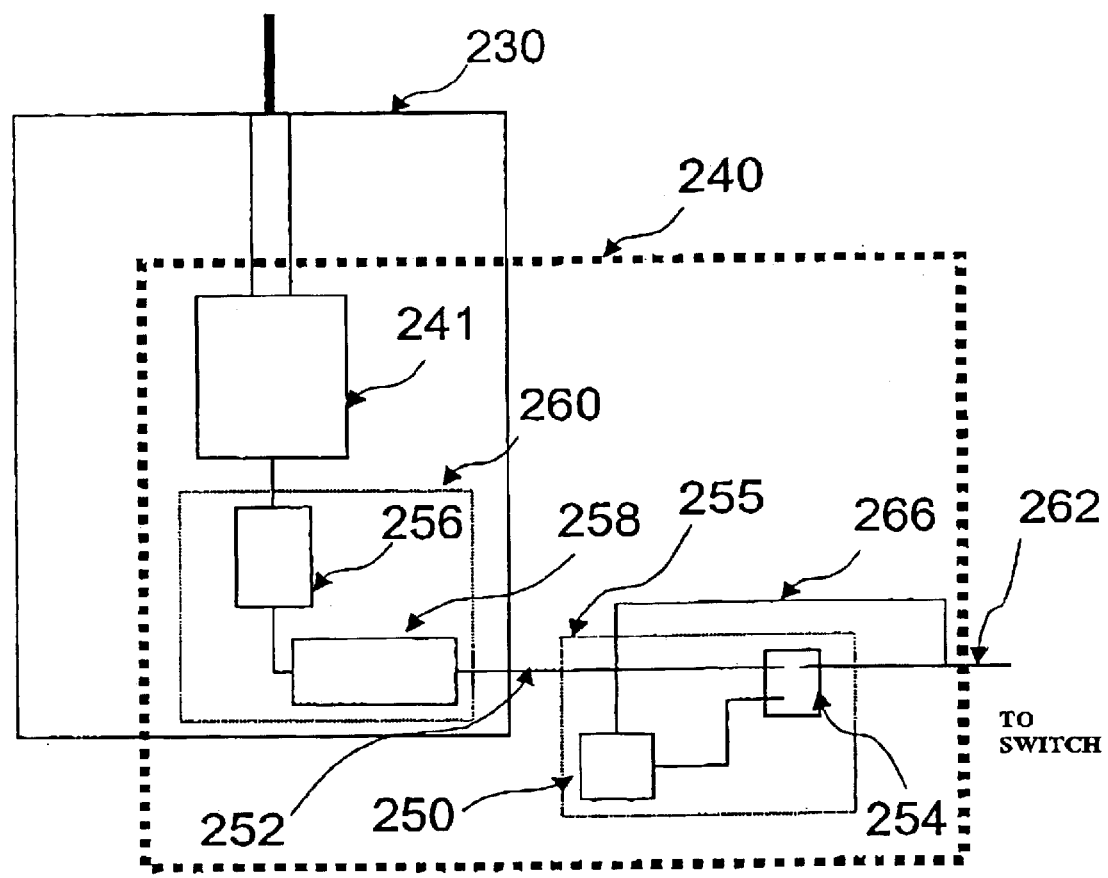
FIG. 11 is a schematic diagram of a detail of FIG. 10.

In FIG. 11, the regeneration component 240 comprises a linear optical receiver 241 of the receiver trunk interface card 230. The linear optical receiver 241 comprises a transimpendence amplifier (not shown) i.e. 1R regeneration is performed on the electrical receiver signal within the linear optical receiver 241.

The regeneration unit 240 further comprises an AC coupler 256 and a binary detector component 258 formed on the receiver trunk interface card 230. Together the AC coupler 256 and the binary detector 258 form a 2R regeneration section 260 of the regeneration unit 240.

The regeneration unit 240 further comprises a programmable phase lock loop (PLL) 250 tapped to an electrical input line 252 and connected to a flip flop 254. The programmable PLL 250 and the flip flop 254 form a programmable clock data recovery (CDR) section 255 of the regeneration unit 240.

It will be appreciated by a person skilled in the art that at the output 262 of the programmable CDR section 255 the electrical receiver signal (converted from the received optical CWDM channel signal over optical fibre input 264) is thus 3R regenerated. It is noted that in the example shown in FIG. 8, a 2R bypass connection 266 is provided, to bypass the programmable CDR section 255 if desired.

Returning now to FIG. 10, each of the tributary interface modules e.g. 218 comprises a tributary transceiver interface card 234 and an electrical performance monitoring unit 236. A 3R regeneration unit (not shown) similar to the one described in relation to the receiver trunk interface cards e.g. 230 with reference to FIG. 11 is provided. Accordingly, 3R regeneration is conducted on each received electrical signal converted from received optical input signals prior to the 16×16 switch 226.

As can be seen from the connectivity provided through the electrical motherboard 216, each of the electrical switches 226 facilitates that any trunk interface card e.g. 230, 232 or tributary interface card e.g. 218 can be connected to any one or more trunk interface card e.g. 230, 232, or tributary interface card e.g. 218. Accordingly, e.g. each wavelength channel signal received at the western network interface module 214, e.g. at receiver trunk interface card 238 can be dropped at the network node associated with the network node structure 200 via any one of the tributary interface modules e.g. 218, and/or can be through connected into the optical network trunk east 220 via the east network interface module 212.

Furthermore, it will also be appreciated by the person skilled in the art that the network node structure 200 is west-east/east-west traffic transparent. Also, due to the utilisation of network interface modules 212, 214 which each incorporate a 16×16 switch 226, a redundant switch is readily provided for the purpose of protecting the tributary interface cards e.g. 218 from a single point of failure. The tributary interface cards e.g. 218 are capable of selecting to transmit a signal to either (or both) network interface modules 212, 214 and the associated switches e.g 226. The function of the switches e.g. 226 is to select the wavelength and direction that the optical signal received from the tributary interface cards e.g. 218 will be transmitted on and into the optical network.

One of the advantages of the network structure 200 (FIG. 10) is that the electronic switches support broadcast and multicast transmissions of the same signal over multiple wavelengths. This can have useful applications in entertainment video or data casting implementation. Many optical add/drop solutions do not support this feature, instead, they only support logical point-point connections since the signal is dropped at the destination node and does not continue to the next node.

It will be appreciated by the person skilled in the art that numerous modifications and/or variations may be made to the present invention as shown in the specific embodiments without departing from the spirit or scope of the invention as broadly described. The present embodiments are, therefore, to be considered in all respects to be illustrative and not restrictive.

In the claims that follow and in the summary of the invention, except where the context requires otherwise due to express language or necessary implication the word "comprising" is used in the sense of "including", i.e. the features specified may be associated with further features in various embodiments of the invention.

What is claimed is:

1. A method of thermally controlling a WDM multiplexer module, the method comprising the steps of:

maintaining a first stage controlled temperature environment inside the module, maintaining a second stage controlled temperature environment in at least a portion of the inside of the module;

locating at least one heat generating electrical component in the first stage controlled temperature environment, and locating at least one optical component in the second stage controlled temperature environment, wherein temperature variations in the second stage controlled temperature environment are smaller than temperature variations in the first stage controlled temperature environment.

2. A method as claimed in claim 1, wherein at least one optical component comprises at least one laser source, and the source temperature of the laser source is substantially governed by the second stage controlled temperature environment.

3. A method as claimed in claim 1 or wherein the method further comprises, during start-up or re-start of the module, the step of sequentially switching on the electrical components based on operating temperature specifications and heat generating characteristics of the electrical components to facilitate creation of the first stage controlled temperature environment.

4. A method as claimed in claim 1 or wherein the maintaining of the first and second stage controlled temperature environments comprises utilising at least one heat pipe in communication with a heat sink structure.

5. A method as claimed in claim 4, wherein the heat pipe has a working fluid characterised by a freezing temperature above −400° C., whereby a discontinuity in heat transfer to and from the heat sink structure is created for temperatures below the freezing temperature of the working fluid in the heat pipe for reducing heat loss from the inside of the module.

6. A method as claimed in claim 5, wherein the freezing temperature is about zero ° C.

7. A method of thermally controlling a WDM multiplexer module, the method comprising the steps of:

maintaining a first stage controlled temperature environment inside the module, and maintaining a second stage controlled temperature environment in at least a portion of the inside of the module, wherein temperature variations in the second stage controlled temperature environment are smaller than temperature variations in the first stage controlled temperature environment, and, during start-up or re-start of the module, sequentially switching on electrical components of the module based on operating temperature specifications and heat generating characteristics of the electrical components to facilitate creation of the first stage controlled temperature environment.

8. A method of thermally controlling a WDM multiplexer module, the method comprising the steps of:

maintaining a first stage controlled temperature environment inside the module, and maintaining a second stage controlled temperature environment in at least a portion of the inside of the module, wherein temperature variations in the second stage controlled temperature environment are smaller than temperature variations in the first stage controlled temperature environment, wherein the maintaining of the first and second stage controlled temperature environments comprises utilizing at least one heat pipe having a working fluid characterized by a freezing temperature above −40° C., whereby a discontinuity in heat transfer to and from a heat sink structure of the module is created for temperatures below the freezing temperature of the working fluid in the heat pipe for reducing heat loss from the inside of the module.

* * * * *